United States Patent [19]
Reymond

[11] Patent Number: 5,510,729
[45] Date of Patent: Apr. 23, 1996

[54] OUTPUT CHARACTERISTICS STABILIZATION OF CMOS DEVICES

[75] Inventor: Welles Reymond, Waterbury, Conn.

[73] Assignee: General DataComm, Inc., Middlebury, Conn.

[21] Appl. No.: 411,342

[22] Filed: Mar. 27, 1995

[51] Int. Cl.⁶ .................................... H03K 19/0175
[52] U.S. Cl. ................ 326/33; 326/86; 326/31; 327/541
[58] Field of Search ................ 326/86, 33, 31, 326/34; 327/538–541, 543

[56] References Cited

U.S. PATENT DOCUMENTS

| | | | |
|---|---|---|---|
| 4,783,607 | 11/1988 | Hsieh | 326/33 |
| 4,791,326 | 12/1988 | Vajdic | 327/541 |
| 4,857,770 | 8/1989 | Phrtovi | 327/541 |
| 5,066,873 | 11/1991 | Chan | 327/541 |
| 5,334,882 | 8/1994 | Ting | 326/86 |
| 5,428,303 | 6/1995 | Pasqualini | 326/27 |

*Primary Examiner*—Edward P. Westin
*Assistant Examiner*—Andrew Sanders
*Attorney, Agent, or Firm*—David P. Gordon

[57] ABSTRACT

Output characteristics of CMOS chips are controlled by providing a known and stable current to a representative transistor of known relative size in the CMOS chip, and arranging the output CMOS driving transistor(s) of the chip, which are of known size relative to the representative transistor, in current mirror relationship with the representative transistor. Two primary embodiments of the invention are provided. In a first primary embodiment ($I_{d,SAT}$ stabilization), the representative transistor is a diode-connected transistor with a saturation current which is generated by the current source and which is also provided to drive the output transistor device(s) when it is ON. In the second primary embodiment ($R_{ON}$ stabilization), instead of being diode-connected, a servo is used to adjust the gate voltage of the representative device until it is greater than the drain voltage by a desired amount. In this manner, the resistance ($R_{ON}$) characteristics of the representative device and hence the driving transistors are controlled. The invention has particular applicability to driving unterminated buses, and $I_{d,SAT}$ embodiment can be arranged to provide complementary output bus driving transistors. Because similar known and stable currents are generated on different semiconductor chips, the driving currents of the output devices of the different chips will be similar.

29 Claims, 7 Drawing Sheets

OUTPUT CHARACTERISTICS STABILIZATION OF CMOS DEVICES

BACKGROUND OF THE INVENTION

1. Field of the Invention

The present invention relates to large scale integrated (LSI) complementary metal-oxide semiconductor (CMOS) technology. More particularly, the present invention relates to apparatus and techniques for stabilizing the output characteristics of a plurality of CMOS LSI chips. The present invention has particular application, although is not limited to providing separate LSIs which are used to drive a common unterminated data bus, where the output characteristics of the CMOS LSIs are advantageously stabilized or matched in order to improve system performance.

2. State of the Art

It is well known that in the manufacture of a single LSI chip, it is possible to match and scale the characteristics of the transistors on that chip. The matching and scaling properties result from the fact that all devices on a single chip are subject to the same manufacturing process, as well as operating temperatures (T) and voltages (e.g., $V_{DD}$). However, it is also well known that the absolute properties of transistors on a chip cannot be closely controlled, and that a matching of transistor characteristics (e.g., $R_{ON}$) on different chips is not presently possible. Indeed, the characteristics on CMOS devices of different LSI chips can vary by as much as three to one.

FIG. 1 illustrates a situation where it would be beneficial to be able to stabilize (match) the output characteristics of different CMOS chips. FIG. 1 is a simplified prior art diagram of a plurality of CMOS devices 50a, 50b, 50c coupled to a common unterminated bus 54, where each CMOS device 50 has an open drain driver $T_3$ for driving the common unterminated bus 54. For illustration purposes, the bus 54 is pulled up with a current $I_{PU}$ by a clamped current source 56 from a voltage $V_C$ through a diode having a voltage differential of $V_D$. For this example, the bus 54 can be assumed to act as a lumped load capacitance $C_T$. The CMOS device 50 drives the bus 54 by turning on the driver transistor $T_3$ which is in turn controlled by a two transistor gate controller having transistors $T_1$, $T_2$. The transistors $T_1$ and $T_2$ are arranged to function as an inverter, and selectively couple the gate of the driver transistor $T_3$ to $V_{CC}$ or ground. In particular, when a high data signal is applied to the gates of transistors $T_1$, $T_2$, the p-type transistor $T_1$ turns OFF and the n-type transistor $T_2$ turns ON. The voltage at the gate of transistor $T_3$ is thereby pulled low by transistor $T_2$ which turns transistor $T_3$ OFF. When transistor $T_3$ is OFF, the voltage level of the bus 54 remains HIGH. However, when a low data signal is applied to the gates of transistors $T_1$, $T_2$, the p-type transistor $T_1$ turns ON and the n-type transistor $T_2$ turns OFF. The voltage at the gate of transistor $T_3$ is thereby pulled high by transistor $T_1$ which causes transistor $T_3$ to turn ON. When transistor $T_3$ is ON, the voltage of the bus 54 is pulled LOW, as transistor $T_3$ is coupled to ground.

The normal high level voltage of the bus is represented by $V_{HO}$ which equals $V_C$ plus $V_D$, and the normal low level voltage of the bus is represented by $V_{LO}$ and can be graphically determined by the intersection of the pull-up current $I_{PU}$ and the $R_{ON}$ characteristic of the particular $T_3$ device (as seen in FIG. 5 discussed below). Thus, $V_{LO}$ is poorly defined. The rising change in voltage of the bus when the bus is allowed to go HIGH and is pulled HIGH by the current $I_{PU}$ will generally be a linear ramp (dr/dt= $I_{PU}/C_T$), where $I_{PU}$ is the pull-up current of the bus. The rising time $t_R$ may be expressed as $C_T(V_{HO}-V_{LO})/I_{PU}$. The falling change in voltage on the bus over time (i.e. when the bus is driven LOW by driver $T_3$), however, is generally ill defined and non-linear due to the non-linear characteristics (e.g., $R_{ON}$ and $I_{D,SAT}$) of the drivers $T_3$. Moreover, the ON characteristics of different driver devices $T_3$ are different because each device is subject to different $V_{CC}$, temperature, and semiconductor chip processing parameters, and may vary by as much as 3:1.

SUMMARY OF THE INVENTION

It is therefore an object of the invention to provide 8 apparatus and techniques for matching the output characteristics of different CMOS LSI chips.

It is another object of the invention to provide an LSI chip where the output characteristics of CMOS devices on the chip are selectable (programmable).

It is a further object of the invention to provide apparatus and techniques for matching the output characteristics of a plurality of CMOS chips which are driving a common unterminated bus.

It is an additional object of the invention to provide apparatus and techniques for stabilizing the outputs of different CMOS LSIs so that a ratio of their output characteristics is reduced to less than 1.4:1.

In accord with these objects which will be discussed in detail below, on each chip which is to be stabilized (matched), a known and stable current is applied to a representative transistor of known relative size, and the output CMOS driving transistor(s) of the chip which are of known size relative to the representative transistor are arranged in current mirror relationship with the representative transistor. The current mirrors are arranged by coupling the gates of the representative and driving transistors to the same voltage, and by coupling the sources of those transistors to ground.

Two primary embodiments of the invention are provided. In a first primary embodiment ($I_{d,SAT}$ stabilization), the drain and gate of the representative device are coupled together so that a saturation voltage ($V_{d,SAT}$) which is generated by a current provided by a current source and flowing through the representative device is also provided to drive the gate(s) of the output transistor device(s) when the output transistor(s) is ON. In other words, the gate to source voltage $V_{gs}$ necessary to support the known and stable current ($I=I_d$) is generated at the representative device and is applied to the gate of the device to be stabilized (when ON) which is in current mirror relationship with the representative device. In accord with preferred aspects of the first primary embodiment, different current sources, including a mostly on-chip current source are provided. In addition, a complementary output bus driver embodiment is provided.

In a second primary embodiment ($R_{ON}$ stabilization) which is substantially implemented on-chip, the drain of the representative device which receives the stable current is not coupled to the gate of the representative device, but rather a servo utilizing an op amp is used to adjust the gate voltage of the representative device until the gate voltage is greater than the drain voltage by a desired amount. In this manner, the resistance ($R_{ON}$) characteristics of the representative device and hence the driving transistors are controlled. In other words, the second embodiment allows for the output characteristics to be selectable (programmable).

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
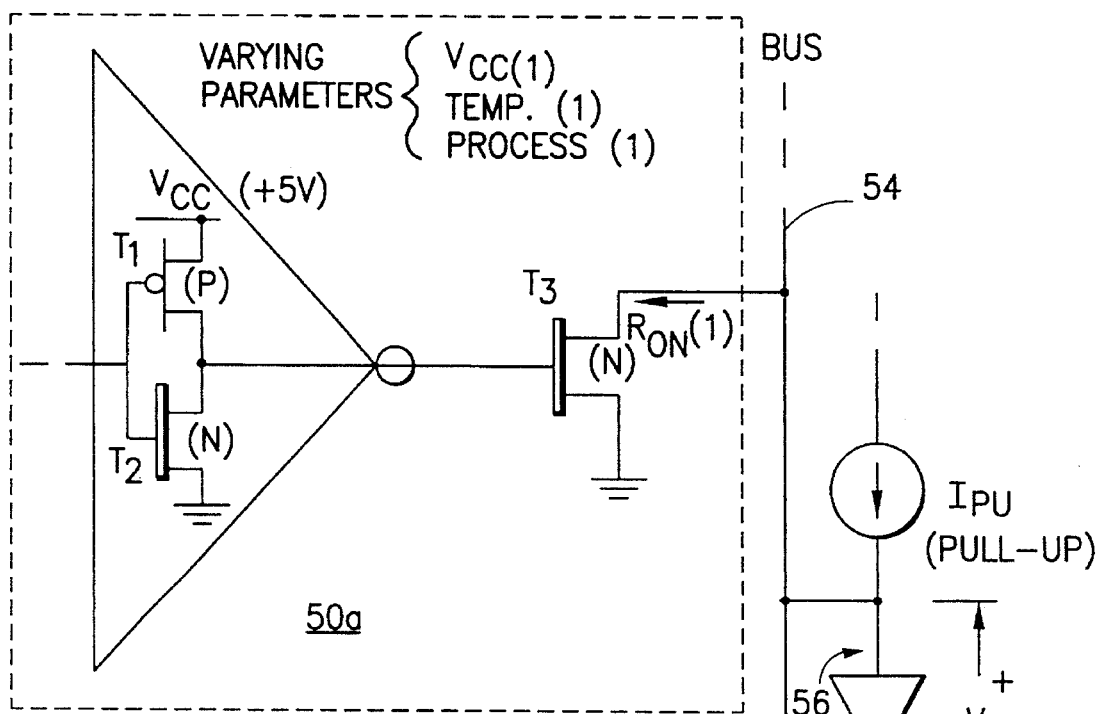
FIG. 1 is a simplified schematic diagram of several prior art CMOS devices driving a common unterminated bus.
Figure 1:
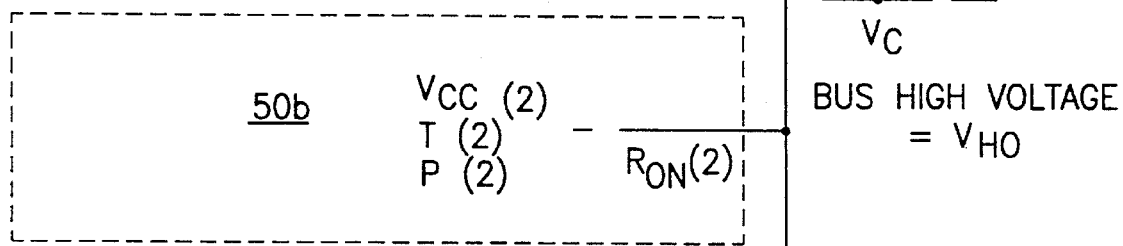
Figure 1:
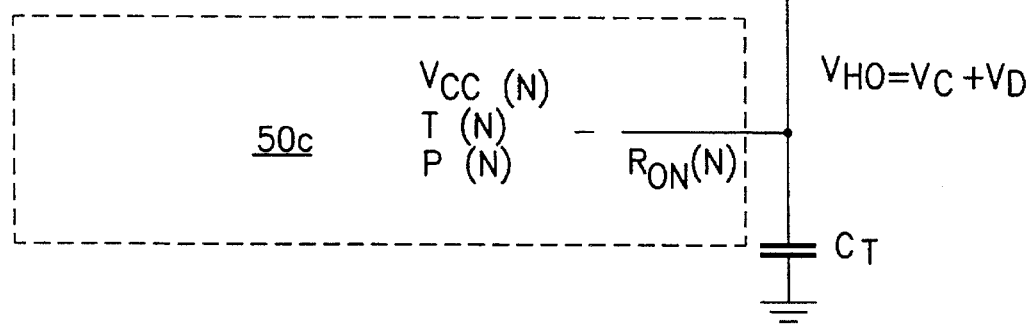
Figure 2:
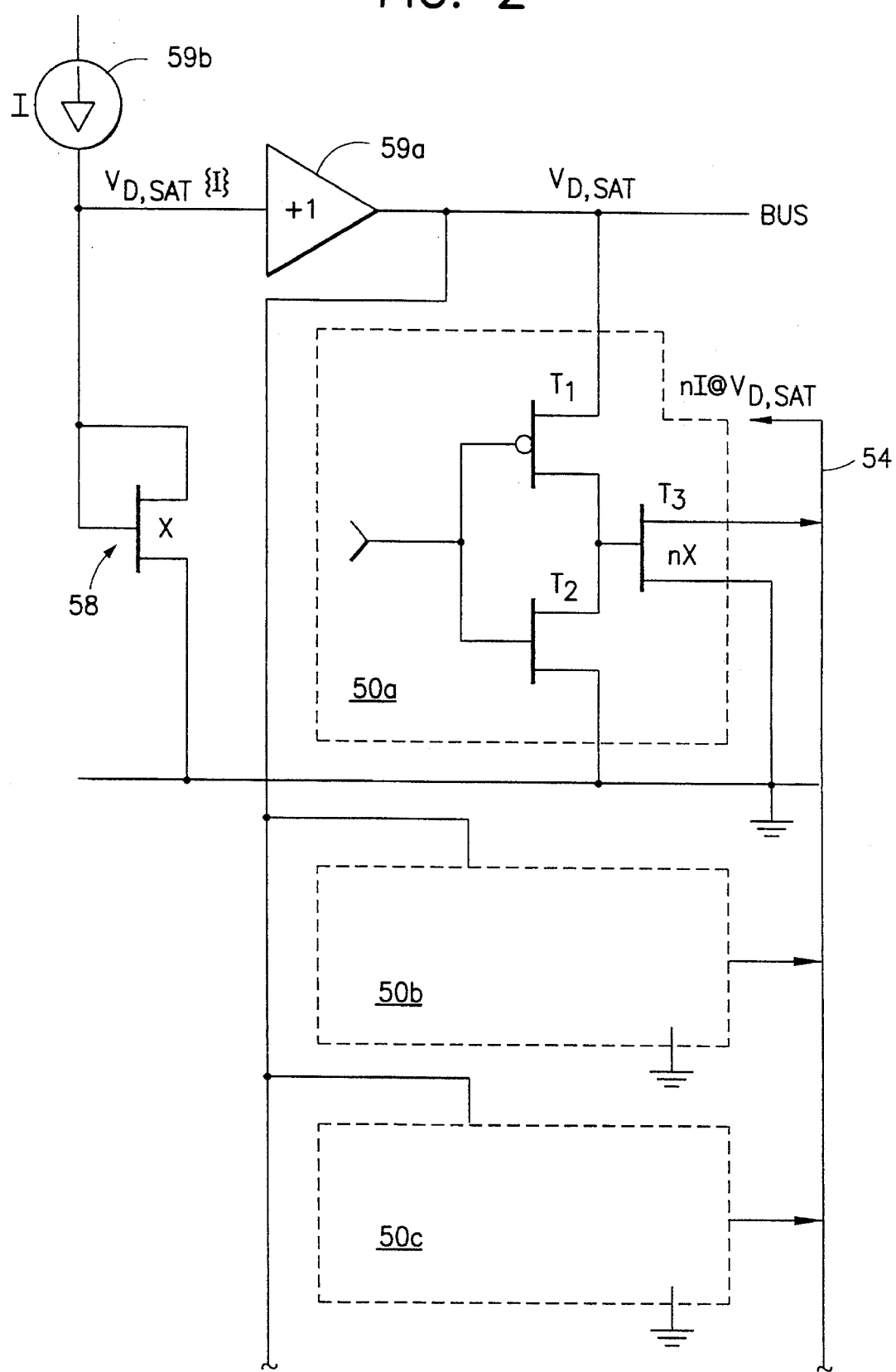
FIG. 2 is a simplified circuit diagram of a first embodiment of a CMOS output device stabilization circuit used in FIG. 3.

Turning to FIG. 2, a simplified circuit diagram is seen which illustrates the concept of saturated drain current stabilization. The circuit of FIG. 2 is located on a single chip and includes several (e.g., eight) devices $50a$, $50b$, $50c$ ... , each having transistors $T_1$, $T_2$, and $T_3$ arranged as discussed above with reference to prior art FIG. 1, a representative device transistor 58, a buffer/amplifier 59a, and a current source 59b. The current source 59b is coupled to the input of the buffer/amplifier 59a as well as to the gate and drain of the representative diode-connected transistor device 58 which has its source coupled to ground. The output of the buffer/amplifier 59a is coupled to the source of transistor $T_1$. As will be discussed in more detail below, the representative device transistor 58 is arranged in a current mirror relationship with each of the driving transistors $T_3$.

More particularly, the output of the output devices 50 (50a, 50b ...) are stabilized by selecting a representative device 58 of known relative size X on the same chip as the driving transistors $T_3$ which have a known relative size of nX. The gate and drain of the representative device 58 is subjected to a known and stable current I. The current I may be derived by providing a constant voltage in conjunction with a precision resistor of known resistance, or by other means such as described below with reference to FIGS. 2a and 2b. Regardless, the known and stable current which is applied to the gate and drain of the representative device 58 causes the device 58 to be saturated with current passing through the device. The gate voltage $V_{GS}$ (equal to the drain voltage $V_{DS}$) necessary to support the saturated drain current $I_D$ (equal to the known and stable current I) is taken from the gate of the representative device 58 and applied to the gate of each driving transistor $T_3$ in lieu of $V_{DD}$ when transistor $T_1$ of device 50 is turned ON by a low input control signal. Because the representative device 58 is diode-connected transistor between ground and the known current source 59b, a voltage $V_{D,SAT}\{I\}$ necessary to support the current I is generated in the representative device 58. This known voltage is taken from the gate and drain of device 58 and applied to devices 50a, 50b, 50c ... in lieu of $V_{DD}$. Since the unterminated bus 54 acts like a capacitor, the saturated drain current $I_D$ through the open drain driver transistor $T_3$ will be a function of the total capacitance of the bus, and the change in voltage on the bus over time can be expressed by:

$$I_D = C_T \frac{dv}{dt} \qquad (1)$$

Thus, for a constant capacitance of the bus 54, during a given time, the current through the drain of the driving transistor $T_3$ (when saturated) will be determined by how ON the driving transistor is, which is determined by the voltage applied to its gate. The gate voltage is selected by the switches $T_1$ and $T_2$ to be either ground or the voltage of the drain of the representative device 58 $V_{D,SAT}\{I\}$. Since the gates of transistors 58 and $T_3$ are subjected to the same voltages ($V_{D,SAT}\{I\}$) when transistor $T_3$ is ON, and since the sources of transistors 58 and $T_3$ are both coupled to ground, the representative transistor 58 and the driving transistors $T_3$ form current mirrors. In addition, since all of the devices on the same chip have substantially the same characteristics proportional to their relative size, the current flowing through the drains of the driving transistors $T_3$ will be proportional to the current flowing through the drain of the representative device 58. In fact, since the relative sizes of the transistors 52 and 58 are known to be proportional by the factor "n" and the current I applied to device 58 is known and stable, the current which flows through driving transistors $T_3$ will be nI for the gate voltage of $V_{D,SAT}\{I\}$.

Figure 2A:
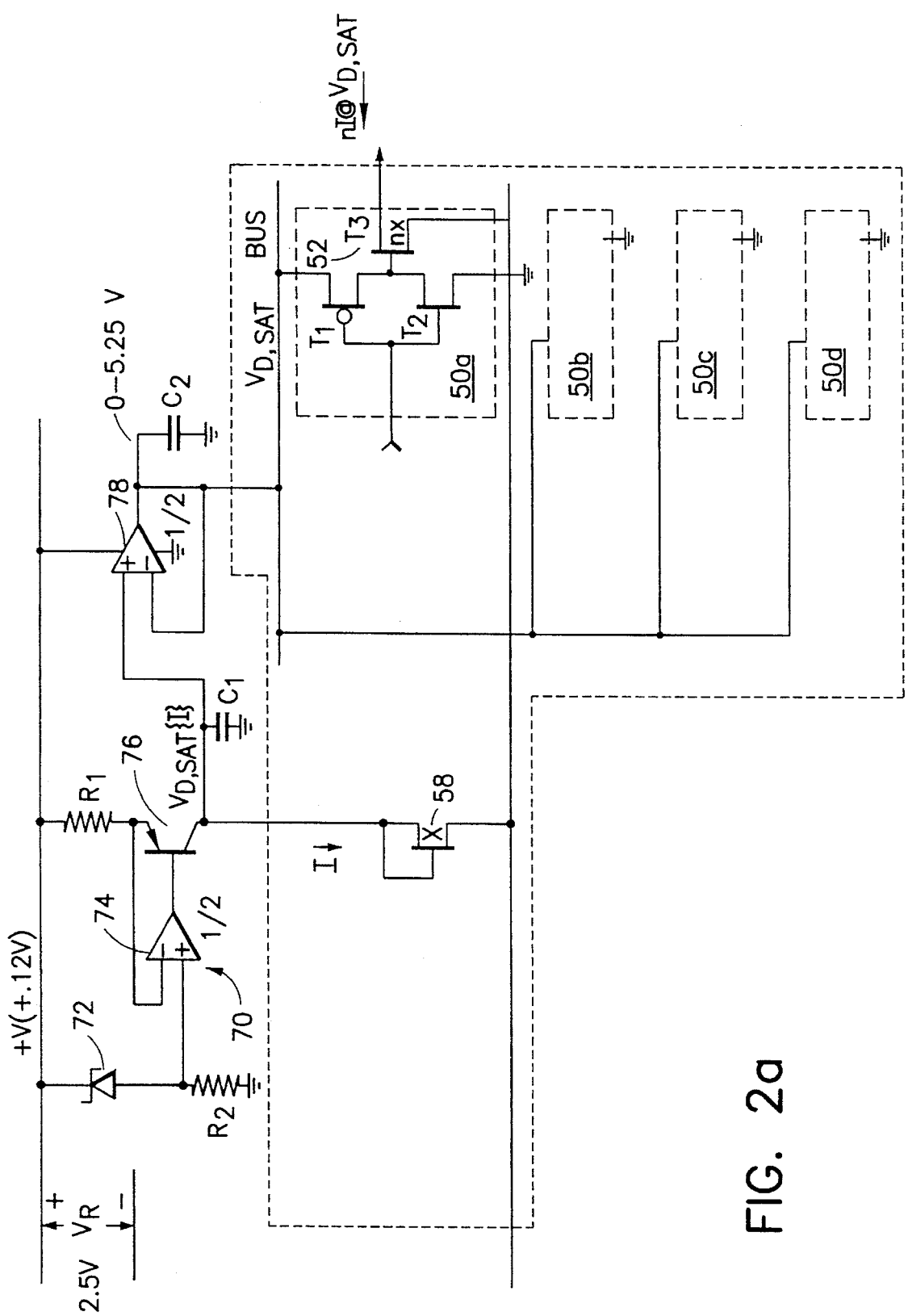
FIG. 2a is a simplified circuit diagram showing the CMOS output device stabilization circuit of FIG. 2 in conjunction with a stable off-chip current source.

Details of one preferred current source for the CMOS output device stabilization circuit of FIG. 2 is shown in FIG. 2a where the current source is implemented substantially off of the CMOS chip. The operation of the on-chip elements (indicated by the dotted lines) is substantially the same as the embodiment described above with reference to FIG. 2. However, in the embodiment of FIG. 2a, the known and stable current I is supplied to the gate and drain of the diode-connected representative transistor 58 from an external circuit, and the saturated drain voltage $V_{D,SAT}\{I\}$ generated in the representative device 58 is fed through an external follower buffer 78 to the output devices 50 in lieu of $V_{DD}$. In particular, the stable current and voltage generating circuit includes: an external voltage regulator 70 having resistors $R_1$ and $R_2$, a zener diode 72, an op amp 74, and a pnp transistor 76; and a buffer amplifier 78 with associated capacitors $C_1$ and $C_2$. The voltage regulator 70 is arranged with an external voltage source V+ being coupled to the emitter of transistor 76 via the resistor $R_1$ of known resistance. The collector output of transistor 76 is coupled to the on-chip drain and gate of the representative device 58 as well as to the positive input of the follower buffer 78. The gate of transistor 76 is coupled to the output of the op amp 74. The negative input to the op amp 74 is taken from the emitter of the transistor 76, while the positive input is taken from a node between the Zener diode 72 and the resistor R2. It is noted that the Zener diode 72 is coupled to the voltage source V+, while the resistor $R_2$ is coupled to ground.

When the transistor 76 is ON (i.e., the base voltage of the pnp transistor 76 is typically 0.5V lower than the emitter voltage), a current I will be applied to the representative device 58 as described above. In order to stabilize the current I so that it is not dependent on the voltage V+, a known and stable voltage differential $V_R$ is provided by the Zener diode 72. The voltage VR taken from the anode of diode 72 is applied to the positive input of the op amp 74. The negative input of the op amp 74 is taken from the voltage across resistor R1. The output of the op amp 74 is applied to the base of the transistor 76. The conductivity of the transistor 74, and thus the value of the current I, is stabilized by the constant voltage differential $V_R$, because if the voltage V+ increases (which would tend to increase the current through resistor R1, transistor 76 and representative device 58), the voltage across R2 increases (the voltage drop across the Zener diode 72 being constant), thereby causing the voltage supplied to the positive input of the op amp 74 to increase. As a result, the output voltage of the op amp 74 will increase, thereby increasing the voltage applied to the base of the transistor 76, which will start to turn the transistor 76 off and decrease the current flow. On the other hand, if the voltage V+ decreases (which would tend to decrease the current through resistor R1, transistor 76 and representative device 58), the voltage across resistor R2 decreases and causes the op amp 74 to decrease the voltage applied to the base of switch 76. As a result, transistor 76 will be turned more fully on, which would increase the current flow. Put more simply, the op amp 74 will always try to cause the voltage at its negative input to equal the voltage at its positive input. Since the voltage at the positive input is 2.5V less than V+, the op amp will cause the voltage at across R1 to equal 2.5V, thereby generating a constant, stable current.

As shown in FIG. 2a, the saturated drain voltage $V_{D,SAT}${I} from the collector of transistor 76 (and from the drain of the representative device 58) is filtered by capacitor C1 to remove high frequency noise and applied to one input of a buffer amplifier 78. The other input of the buffer amplifier 78 is the feedback of the amplifier output. The function of the buffer amplifier is to provide a low impedance $V_{D,SAT}$ bus free of excessive noise.

Figure 2B:
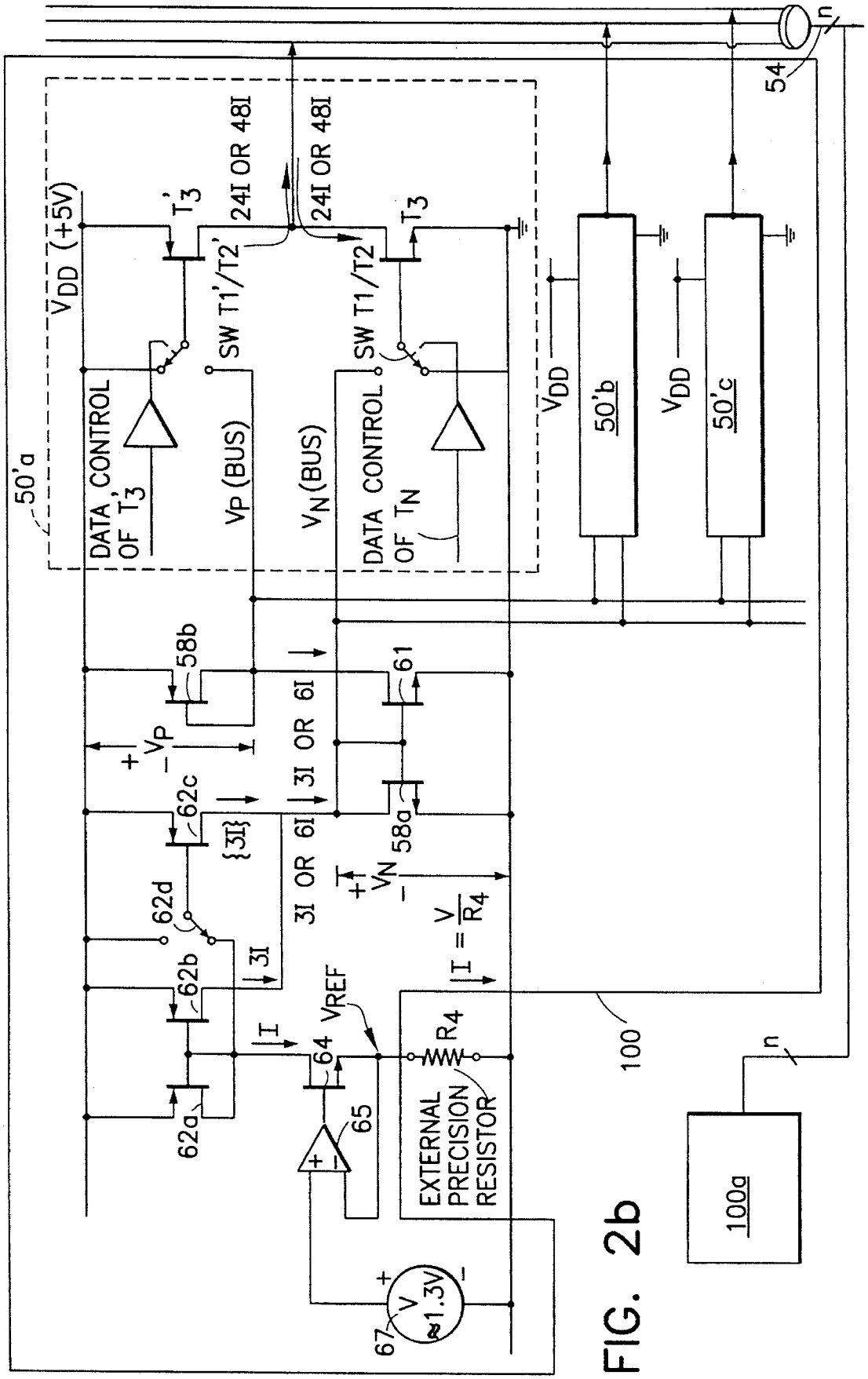
FIG. 2b is a simplified circuit diagram of a modification to the first embodiment of the CMOS output device stabilization circuit, where a complementary CMOS output device stabilization circuit is used to drive the unterminated bus both high and low, and where the current source is controllable and mostly on-chip.

A presently preferred alternative embodiment of the saturated drain current stabilization technique is seen in FIG. 2b, where a complementary driving circuit is seen with a mostly on-chip current source. In the embodiment of FIG. 2b it is seen that chip 100 includes a plurality of output devices 50'a, 50'b, 50'c . . . which are complementary devices with complementary driving transistors $T_3$ and $T'_3$. As was the case with the previously described embodiments, the complementary output transistors are controlled by control transistors $T_1$ and $T_2$ (and $T'_1$ and $T'_2$) which are shown as switches swT1/T2 and swT'1/T'2. The control transistors are in turn controlled by data control signals. As will be described in detail below, the amount of current flowing through the complementary driving transistors in their saturation region is related directly to the amount of current flowing through the representative transistors 58a and 58b, as the driving transistors are in current mirror relationship with the representative transistors. In turn, the amount of current flowing through the representative transistors 58a and 58b is controlled by a mostly on-chip current source.

The current source of the embodiment of FIG. 2b includes a transistor 64, an operational amplifier 65, a band-gap reference voltage source 67, and a preferably off-chip (external) precision resistor R4. This well known follower circuit configuration regulates accurately a current I in the drain of transistor 64 equal to the voltage of the voltage source 67 divided by the resistance of resistor R4. In particular, operational amplifier 65 compares the voltage across resistor R4 with the constant reference voltage generated by the band gap reference voltage source 67. If the current I flowing through transistor 64 increases due to an increase in $V_{DD}$, or for any other reason, the voltage across resistor R4 will increase, thereby increasing the negative input voltage to comparator 65 and decreasing the output voltage which is applied to transistor 64. As the voltage to the gate of the transistor 64 is decreased, the current flow through the transistor is decreased; i.e., regulated. Likewise, if the current I should decrease due to a decrease in voltage $V_{DD}$, or for any other reason, the voltage across resistor R4 will decrease, which in turn will cause the comparator 65 to raise its output voltage which is applied to the gate of transistor 64. An increased voltage will tend to increase the current flow through transistor 64, thereby similarly stabilizing the current I. Put another way, the op amp 65 tries to keep the voltage at the negative input equal to the preset stable voltage supplied to its positive input. As a result, the voltage across R4 will always be stabilized by the op amp 65, and the resulting current will be stable. It should be noted that the current I is adjustable or programmable by selecting the value of the resistor R4. Thus, it is desirable to provide resistor R4 off-chip, so that the precision of resistor R4 can be kept high, and so that the desired current can be easily controlled.

The current generated in transistor 64 is provided via the drain of transistor 64 to the diode-connected transistor 62a which has its source coupled to the voltage rail $V_{DD}$, and its gate and drain coupled to the drain of transistor 64. Coupled in current-mirror relationship with transistor 62a are one or both of transistors 62b, and 62c. In particular, transistor 62b has its gate coupled to the gate of transistor 62a, its source coupled to the voltage rail $V_{DD}$, and its drain coupled to the drain of the first representative diode-connected transistor 58a. As shown, transistor 62b is chosen to be three times as wide as transistor 62a. Thus, if a current I flows through transistor 62a, a current of 3I will flow through transistor 62b to representative diode-connected device 58a. When switch 62d is in the position shown in FIG. 2b, transistor 62c is likewise coupled in current-mirror relationship with transistors 62a and 62b, with the gate of transistor 62c coupled to the gates of transistors 62a and 62b, and the source of transistor 62c coupled to the voltage rail $V_{DD}$. If transistor 62c is likewise arranged to be three times the width of transistor 62a, an additional current of 3I will flow through transistor 62c to representative device 58a when the switch 62d is properly positioned. However, when switch 62d is coupled to the voltage rail $V_{DD}$, it effectively open circuits transistor 62c, such that no current will flow through transistor 62c. It should be appreciated that switch 62d is provided to permit additional control over the current generated by the driving circuit of the invention. Thus, for example, if the lumped capacitance of the unterminated data bus driven by the output devices 50' of the circuit is large (e.g., due to numerous devices being coupled to the data bus), switch 62d might be arranged to increase the current being generated.

As will be appreciated by those skilled in the art, and as discussed above, the driving transistor $T_3$ is arranged in current mirror relationship with the representative transistor device 58a, with the gate of transistor 58a coupled to the gate of transistor $T_3$ (when enabled), and the sources of transistors 58a and $T_3$ coupled to the voltage rail $V_{SS}$ (ground). Thus, the amount of current flowing through transistor $T_3$ will depend upon the relative sizes of transistors $T_3$ and 58a. Where an 8:1 ratio is established, a saturation current of 24I or 48I (depending upon the position of switch 62d) will be generated by transistor $T_3$.

Because the embodiment of FIG. 2b is a complementary driving circuit, it is necessary to create a similar current in transistor $T'_3$. Thus, an additional transistor 61 and a second diode-connected representative transistor 58b are provided. Transistor 61 is arranged in current-mirror relationship with transistor 58b with its gate coupled to the gate of transistor 58b, and its source coupled to ground. The drain of transistor 61 is coupled to the drain of the diode-connected transistor 58b, and the source of transistor 58b is coupled to the high voltage rail $V_{DD}$. Thus, any current flowing through representative transistor 58a will be likewise be mirrored in transistor 61 and pulled through the second diode-connected representative transistor 58b. Since the second representative transistor 58b is arranged in current mirror relationship with the p-type driving transistor $T'_3$ (with the gates being coupled by swT'1/T'2), the amount of current flowing through transistor $T'_3$ will depend upon the relative sizes of transistors $T'_3$ and 58a. Where an 8:1 ratio is established, a pull-up saturation current of 24I or 48I (depending upon the position of switch 62d) will be generated by transistor $T'_3$.

It should be appreciated that a single current source of FIG. 2b is used to drive several complementary output devices 50'a, 50'b, 50'c . . . which are on a single chip 100. Thus, each output device 50' includes bus driving transistors $T_3$ and $T'_3$ which are in current mirror relationship with transistors 58a and 58b respectively.

It will also be appreciated that where the chip is interfacing to a data bus 54, the number of bus driving transistors on the chip will generally correlate to the width "n" (i.e., number of bits) of the data bus. As all of the bus driving transistors of the single chip are arranged in current mirror relationship with the representative transistor 58 which draws the known and regulated current, all of the bus driving transistors on the single chip 100 will be well matched to each other. In addition, since the known and regulated current is reasonably reproducible on other chips, and since the current in the driving transistors of the different chips will be a function of the known and regulated current, the bus driving transistors on different chips (e.g., 100, 100a, . . . ) can be relatively well matched.

Figure 3:
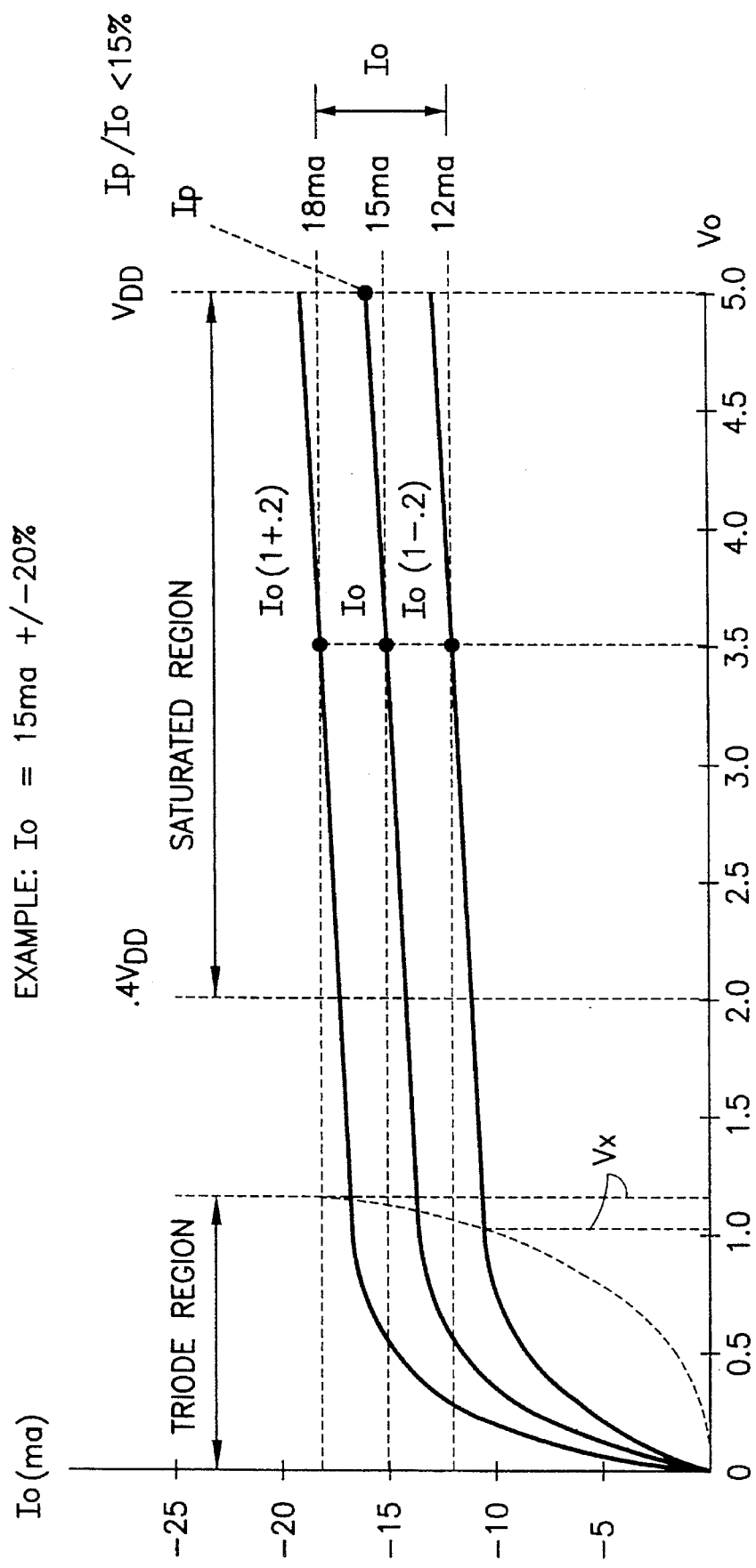
FIG. 3 is a plot comparing the output voltage versus the output current for the driving transistors of the first embodiment of the invention.

In the context of using the invention to provide matched drivers for an unterminated bus, it will be appreciated that it is desirable to be able to have all drivers charge and discharge the bus at controlled rates. A typical output current characteristic for a CMOS driver charging a bus from low to high is shown in FIG. 3. It can be appreciated from the example of FIG. 3 that when the voltage at the drain of the CMOS driver such as transistor $T_3$ reaches approximately 1V, the driver enters the saturated region such that an increase of voltage at its drain will not significantly increase the amount of current it will conduct. Thus, if it is desired to run the driver in a saturated state with the current flowing the driver being about 15 milliamps, it is desirable to choose the values of the voltage source 67 and the resistor R4 carefully. For example, if voltage source 67 is a 1.3275V voltage source, and resistor R4 is chosen to be a 4.2KΩ resistor, then when switch 62d is as shown in FIG. 2b, a driving current of approximately 15 milliamps will be generated in the driving transistor $T_3$ or $T'_3$ when the appropriate switch swT1/T2 or swT1'/T2' is in the position opposite to the position shown in FIG. 2b.

Figure 4:
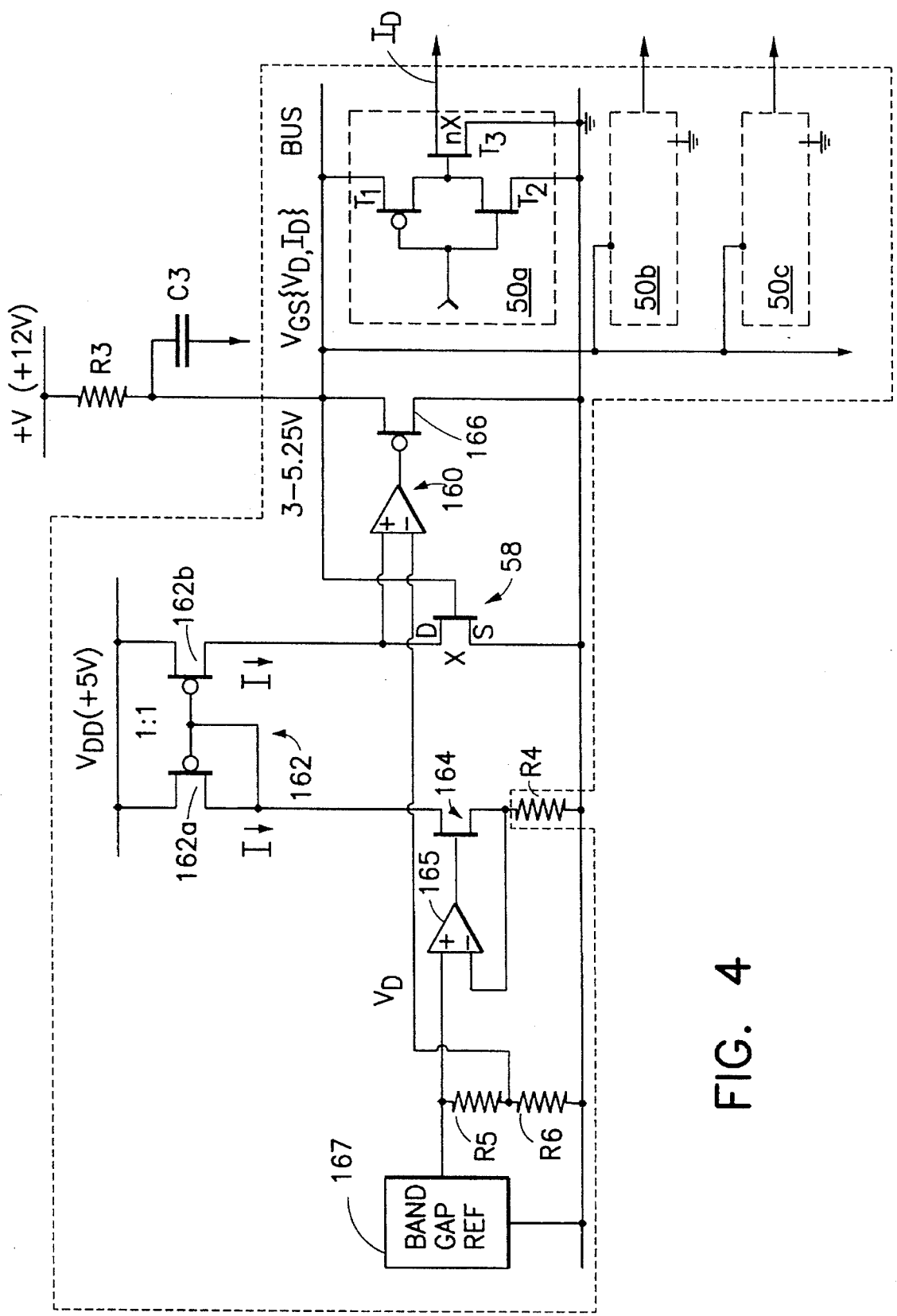
FIG. 4 is a simplified circuit diagram of a second embodiment ($R_{ON}$) of a CMOS output device stabilization circuit which utilizes a stable on-chip current source.

FIG. 4 is a circuit diagram illustrating the concept of ON resistance ($R_{ON}$) stabilization which is integrated on a single chip identified by the dotted lines in FIG. 4. Generally, as seen in FIG. 4, the output of the driving transistor $T_3$ is stabilized by selecting a representative device 58 of known size X on the same chip as the driving transistor(s) $T_3$, and by arranging the driving transistor(s) $T_3$ and representative device 58 in a current mirror arrangement. The drain of the representative device 58 is subjected to a known and stable current I so that the current flowing through the driving transistor $T_3$ will likewise be known and stable. In order to generate the known and stable current to the representative device 58, an op amp 165 having a first input set to a desired voltage is used in conjunction with an external resistor R4 to draw current which is mirrored to the drain of the representative device 58. If the driving transistor $T_3$ of the output device 50 has a size nX compared to the size X of the representative device 58, the current flowing through the driving transistor $T_3$ will be n times the known and stable current I which is applied to the representative device 58. In addition, as will be described in more detail below, in order to control the ON resistance characteristics of the representative transistor (and hence the driving transistor), the circuit includes a second op amp or servo 160 which adjusts the gate voltage VGS of the representative device 58 until a desired drain to source voltage is obtained across the representative device 58 at the stable current I. By being able to control both the stable current I and the drain-source voltage across the representative transistor 58, the ON resistance of the representative transistor 58, and hence the ON resistance of the driving transistor $T_3$ is selectable (programmable).

Turning more specifically to the circuitry of FIG. 4, it will be appreciated that CMOS output device stabilization circuit includes: a plurality of output devices 50a, 50b, 50c, each having transistors $T_1$, $T_2$, and $T_3$; the representative device 58; four resistors R3, R4, R5, and R6, with resistors R5 and R6 forming a voltage divider; four additional CMOS transistors 162a, 162b, 164, 168, with transistors 162a and 162b forming a current mirror; two operational amplifiers 160 and 165; a band-gap voltage reference source 167; and a capacitor C3. Transistors 162a and 162b have their sources coupled to the voltage rail $V_{DD}$, a common gate, and their drains coupled respectively to the drains of transistors 164 and 58. The source of transistor 164 is coupled to an off-chip resistor R4, while the gate of transistor 164 is driven by the output of op amp 165. The negative input to the op amp 165 is obtained from the source of transistor 164, while the positive input to the op amp 165 is taken from the output of the band-gap reference voltage source 167. Resistors R5 and R6 are coupled in series between the output of the band-gap reference voltage source 167 and ground, and a voltage divider node between the resistors is used as the negative input to op amp 160. The positive input to the op amp 160 is taken from the drain of transistor 58 which has its source coupled to ground, and its gate coupled to the source of transistor $T_1$ of the output device 50. The output of op amp 160 is coupled to the gate of transistor 166. Transistor 166 has its drain coupled to ground, and its source coupled to a voltage rail V+ via an off-chip resistor R3. Capacitor C3 couples resistor R3 to ground.

The circuitry of FIG. 4 basically functions as follows. A known current I, which is stabilized as described below, is applied via transistor 162b to the representative device 58 by generating an identical current in transistor 162a; transistors 162a and 162b comprising, e.g., a 1:1 current mirror 162. The current generated in transistor 162a is controlled by transistor 164 which is selectively coupled to ground through a precision resistor R4 of known resistance. As shown in FIG. 4, the resistor R4 is located off the chip so that the output characteristics of the device 50 (as discussed below) can be changed without redesigning the chip. The current I is drawn through current mirror transistor 162a when transistor 164 is ON, as transistor 164 pulls the gate of transistor 162a low (thereby turning transistor 164 ON).

The functioning of transistor 164 is effectively controlled by the operational amplifier 165 which compares the voltage across resistor R4 with the constant reference voltage generated by the band gap reference voltage source 167. If the current I increases due to an increase in $V_{DD}$, Or for any other reason, the voltage across resistor R4 will increase, thereby increasing the negative input voltage to comparator 165 and decreasing the output voltage which is applied to transistor 164. As the voltage to the gate of the transistor 164 is decreased, the current flow through the transistor is decreased; i.e., regulated. Likewise, if the current I should decrease due to a decrease in voltage $V_{DD}$, or for any other reason, the voltage across resistor R4 will decrease, which in turn will cause the comparator 165 to raise its output Y voltage which is applied to the gate of switch 164. An increased voltage will tend to increase the current flow through transistor 164, thereby similarly stabilizing the current I. Put another way, the op amp 165 tries to keep the voltage at the negative input equal to the preset stable voltage supplied to its positive input. As a result, the voltage across R4 will always be stabilized by the op amp 165, and the resulting current will be stable. Thus, the current mirror 162, transistor 164, op amp 165, resistor R4, and the band-gap reference voltage generator 167 are arranged to provide a known and extremely stable current I through the representative CMOS transistor 58. This current, which is proportionally mirrored in the driving transistor $T_3$ of the output device 50 (when transistor $T_1$ is ON), is adjustable by the off-chip resistor R4.

In order to control the $R_{ON}$ characteristics of the representative transistor 58 (and hence the driving transistor $T_3$), it is also necessary to control the drain to source voltage of the representative transistor 58. To accomplish this control, a circuit utilizing op amp 160, transistor 166, resistors R3, R5, R6, and the band gap reference voltage source 167 is utilized. In particular, the voltage divider resistors R5 and R6 are chosen in conjunction with the voltage output of voltage source 167 to provide a stable and desired voltage which is fed to the negative input of the op amp 160. As will be recognized by those skilled in the art, the op amp 160 will always try to keep the voltages at its inputs equal. Thus, the op amp 160 causes its output to drive the gate of transistor 166 to the extent necessary to cause the voltage to its positive input (i.e., the drain voltage of representative transistor 58) to be the same as the stable and desired voltage. This is accomplished via a feedback circuit utilizing transistor 166, resistor R3, and representative transistor 58, in that the source of transistor 166 is coupled to resistor R3 and to the gate of the representative transistor 58, which in turn has its drain coupled to the positive input of op amp 160. Thus, if the voltage at the positive input of the op amp 160 should be higher than the steady, known voltage at the negative input, the voltage output at the op amp 160 will rise, causing transistor 166 to start shutting down. As a result, the voltage at the source of transistor 166 will be pulled up toward V+, as less current will be pulled across resistor R3 by transistor 166. Since the voltage at the source of transistor 166 is applied to the gate of the representative transistor 58, as that voltage rises, transistor 58 is turned on more fully. When transistor 58 turns on more fully, the voltage at its drain, which is the feedback provided to the positive input of the op amp 160, is pulled down. Thus, the feedback circuit is arranged to cause the drain-source voltage of the representative transistor 58 to assume the same desired voltage which is applied to the negative input of op amp 160. By controlling the drain-source voltage and the current flowing through the transistor 58, the $R_{ON}$ characteristics of transistor 58 (and hence transistor $T_3$) can be carefully defined as can be more completely understood with reference to FIG. 5.

Figure 5:
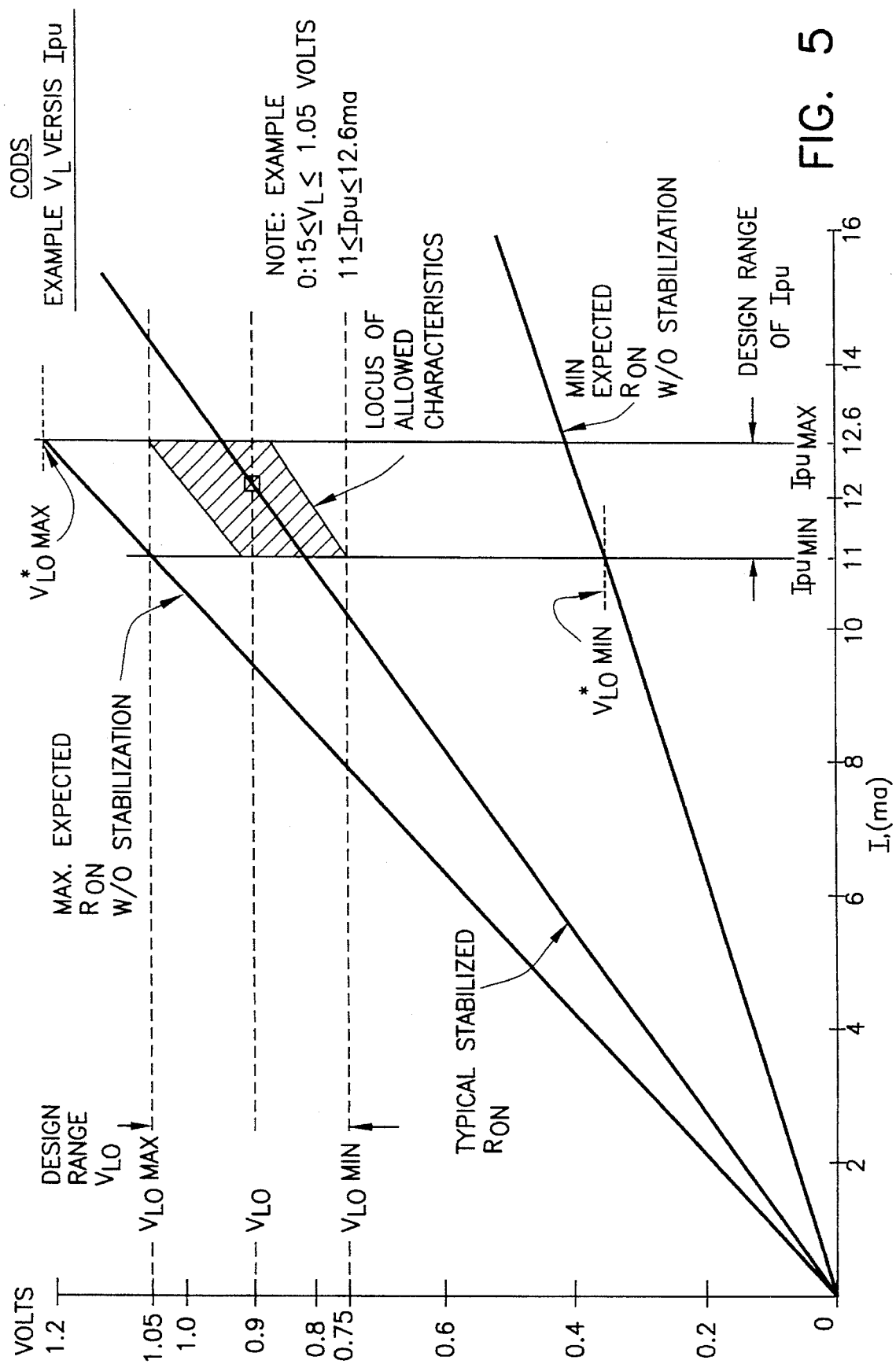
FIG. 5 is a plot comparing the output voltage versus the output current for the driving transistors of the second embodiment of the invention.

Turning to FIG. 5, it can be seen how control of the drain-source voltage of the representative transistor (and hence at the driving transistor) in addition to the current flow through the transistors permits more precise definition of $R_{ON}$ characteristics. Thus, where the current through a driving transistor is preferably about, e.g., 12 milliamps, and thus controllable with stabilization to between about 11.0 and 12.6 milliamps, if the drain-source voltage of the driving transistor can be controlled to be, e.g., .9V±0.15V, an expected $R_{ON}$ value will be established as indicated by the "Typical Stabilized $R_{ON}$" curve. However, without stabilization of the voltage and current (as in the arrangement of FIG. 1), the $R_{ON}$ values can vary greatly as indicated by the curves "Min. Expected $R_{ON}$ W/O Stabilization" and "Max. Expected $R_{ON}$ W/O Stabilization". The result of not controlling the $R_{ON}$ value of the driving transistor is that the $V_{LO}$ of the bus thread is poorly defined (i.e., between 0.4V and 1.3V), and the resulting performance of the system will suffer.

There have been described and illustrated herein apparatus and techniques for stabilizing the output characteristics of CMOS LSI chips. While particular embodiments of the invention have been described, it is not intended that the invention be limited thereto, as it is intended that the invention be as broad in scope as the art will allow and that the specification be read likewise. Thus, while only one embodiment was described with reference to a complementary driver, it will be appreciated that all of the embodiments, including the $R_{ON}$ stabilization circuit could be provided with complementary drivers. Also, while specific circuits were provided with reference to current sources, it will be appreciated that other current source circuits could be utilized, and that the current sources could be completely off-chip or completely on-chip if, and as desired. In fact, it should also be appreciated that the current sources of the invention can include zero (as in FIGS. 2a and 2b), one (as in FIG. 2b), or more step-up stages, which for purposes of the invention should be considered part of the current source. Further, it will be appreciated that the methods and techniques of the invention are closely related to the apparatus of the invention. It will therefore be appreciated by those skilled in the art that yet other modifications could be made to the provided invention without deviating from its spirit and scope as so claimed.

I claim:

1. An apparatus for driving an unterminated data bus having a plurality of threads, comprising:

a) a current source of substantially known and stable current;

b) a representative MOS transistor having a drain coupled to said current source, a source coupled to a first voltage rail, and a gate, said representative MOS transistor being of a known relative first size;

c) a plurality of output devices, each output device having a bus driver, and each bus driver having a first MOS transistor having a source coupled to said first voltage rail, a drain coupled to a respective one of the plurality of threads of said data bus, and a gate coupled to said gate of said representative MOS transistor such that each first MOS transistor, when ON, mirrors a characteristic of said representative MOS transistor, each first MOS transistor being of a substantially identical known relative second size, wherein said representative MOS transistor conducts said known and stable current from said current source, and each of said plurality of bus drivers, when ON, scalingly mirrors the characteristic of said representative MOS transistor as a function of said relative second size and said relative first size, and said representative MOS transistor and said plurality of output devices are located on a single chip.

2. An apparatus according to claim 1, wherein:

each said output device further includes an inverter coupled between said current source and said first voltage rail, said inverter having a bit control input, and said inverter having an output coupled to said gate of said first MOS transistor.

3. An apparatus according to claim 1, wherein:

said inverter comprises a second MOS transistor of a first type and a third MOS transistor of a second type different than said first type, said second MOS transistor having a source coupled to said current source, a gate coupled to said bit control input for said respective output device, and a drain coupled to said gate of said first MOS transistor, and said third MOS transistor having a source coupled to said first voltage rail, a drain coupled to said drain of said second MOS transistor and to said gate of said first MOS transistor, and a gate coupled to said gate of said second MOS transistor and to said control input for said respective output device.

4. An apparatus according to claim 1, further comprising: buffer means coupled between said current source and said plurality of output devices.

5. An apparatus according to claim 1, wherein:

said gate of said representative MOS transistor is connected to said drain of said representative MOS transistor, and said characteristic is a saturation current.

6. An apparatus according to claim 3, wherein:

said gate of said representative MOS transistor is connected to said drain of said representative MOS transistor, and said characteristic is a saturation current.

7. An apparatus according to claim 6, further comprising:

buffer means coupled between said current source and said plurality of output devices.

8. An apparatus according to claim 1, wherein:

said current source comprises voltage means coupled to a second voltage rail for generating a voltage which is known and fixed relative to said second voltage rail, a first resistor coupled to said second voltage rail, an operational amplifier having first and second inputs and an output, said first input being coupled to said voltage means and receiving said voltage which is known and fixed relative to said second voltage rail, and said second input being coupled to said first resistor, and transistor means coupled to said first resistor, to said drain of said representative transistor, and to said output of said operational amplifier, wherein said operational amplifier causes a fixed current to be pulled through said first resistor.

9. An apparatus according to claim 8, wherein:

said voltage means comprises a second resistor and a Zener diode, said Zener diode coupled between said second voltage rail and said second resistor, and said second resistor coupled between said first voltage rail and said first input of said operational amplifier.

10. An apparatus according to claim 8, wherein:

said transistor means coupled to said first resistor comprises a p-type bipolar transistor having an emitter coupled to said first resistor, a base coupled to said output of said operational amplifier, and a collector coupled to said drain of said representative MOS transistor.

11. An apparatus according to claim 10, wherein:

said current source further comprises a follower buffer having a first input coupled to said collector of said p-type bipolar transistor, and a second input and an output coupled to each other, wherein said output of said follower buffer is also coupled to said plurality of output devices.

12. An apparatus according to claim 11, wherein:

said current source further comprises a first capacitor coupled between said collector of said p-type bipolar transistor and said first voltage rail, and a second capacitor coupled between said output of said follower buffer and said first voltage rail.

13. An apparatus according to claim 1, wherein:

said characteristic is an $R_{ON}$ characteristic of said representative transistor, said apparatus further comprising means for controlling the $R_{ON}$ characteristic of said representative MOS transistor, wherein the $R_{ON}$ of said bus driver is inversely proportional to said ratio.

14. An apparatus according to claim 13, wherein:

said means for controlling comprises an operational amplifier means with first and second inputs and an output, a voltage source means with a controlled output voltage, and a MOS control transistor with a source, a drain, and a gate, wherein said drain of said representative MOS transistor and said controlled output voltage are respectively coupled to said first and second inputs of said operational amplifier means, said output of said operational amplifier means is coupled to said gate of said MOS control transistor, said source of said MOS control transistor is coupled to said gate of said representative MOS transistor, and said drain of said MOS control transistor is coupled to said first voltage rail.

15. An apparatus according to claim 14, wherein:

said means for controlling further comprises a first resistor coupled between a second voltage rail and said gate of said representative MOS transistor.

16. An apparatus according to claim 15, wherein:

said voltage source means comprises a band-gap reference voltage source coupled to said first voltage rail and providing a first voltage, second and third resistors arranged as a voltage divider between said first voltage rail and said band-gap reference voltage source, wherein said controlled output voltage is taken from said voltage divider.

17. An apparatus according to claim 1, wherein:

said current source comprises a voltage source means coupled to said first voltage rail for generating a voltage which is known and fixed relative to said first voltage rail, a first resistor coupled to said first voltage rail, an operational amplifier having first and second inputs and an output, said first input being coupled to said voltage source means and receiving said voltage which is known and fixed relative to said first voltage rail, and said second input being coupled to said first resistor, a first current source transistor coupled to said first resistor and to said output of said first voltage rail, and second and third current source transistors coupled together and arranged as a current mirror with said second current source transistor coupled to said first current source transistor, and said third current source transistor coupled to said drain of said representative MOS transistor.

18. An apparatus according to claim 17, wherein:

said first current source transistor has a gate coupled to said output of said operational amplifier, a source coupled to said first resistor, and a drain, said second current source transistor has a drain and a gate coupled to said drain of said first current source transistor, and a source coupled to a second voltage rail, and said third current source transistor has a source coupled to said second voltage rail, a drain coupled to said drain of said representative MOS transistor, and a gate coupled to said gate of said second current source transistor.

19. An apparatus according to claim 14, wherein:

said current source includes said voltage source means, a first resistor coupled to said first voltage rail, a second operational amplifier having first and second inputs and an output, said first input being coupled to said voltage source means, and said second input being coupled to said first resistor, a first current source transistor coupled to said first resistor and to said output of said first voltage rail, and second and third current source transistors coupled together and arranged as a current mirror with said second current source transistor coupled to said first current source transistor, and said third current source transistor coupled to said drain of said representative MOS transistor.

20. An apparatus according to claim 19, wherein:

said first current source transistor has a gate coupled to said output of said second operational amplifier, a source coupled to said first resistor, and a drain, said second current source transistor has a drain and a gate coupled to said drain of said first current source transistor, and a source coupled to a second voltage rail, and said third current source transistor has a source coupled to said second voltage rail, a drain coupled to said drain of said representative MOS transistor, and a gate coupled to said gate of said second current source transistor.

21. An apparatus according to claim 20, wherein:

said voltage source means comprises a band-gap reference voltage source coupled to said first voltage rail and providing a first voltage, second and third resistors arranged as a voltage divider between said first voltage rail and said band-gap reference voltage source, wherein a controlled output voltage for input to said second operational amplifier is taken from said voltage divider.

22. An apparatus according to claim 21, wherein:

said means for controlling further comprises a fourth resistor coupled between a third voltage rail and said gate of said representative MOS transistor.

23. An apparatus according to claim 13, wherein:

said means for controlling is located substantially on said chip.

24. An apparatus according to claim 15, wherein:

said first resistor is located off-chip.

25. An apparatus according to claim 5, further comprising:

a second representative MOS transistor of a type opposite to said representative MOS transistor, said second representative MOS transistor having a drain coupled to said current source, a source coupled to a second voltage rail, and a gate coupled to its source, said second representative MOS transistor being of said known relative first size, wherein, said bus drivers of said plurality of output devices each have a second MOS transistor of said type opposite to said representative MOS transistor having a source coupled to said second voltage rail, a drain coupled to a respective of the plurality of threads of said data bus, and a gate coupled to said gate of said second representative MOS transistor such that each second MOS transistor, when ON, mirrors current in said second representative MOS transistor.

said second representative MOS transistor and said second MOS transistors are located on said single chip.

26. An apparatus according to claim 25, further comprising:

control means for controlling an amount of current flowing through said representative MOS transistor.

27. A system for driving an unterminated data bus, said system comprising:

a plurality of transmitters, each transmitter located substantially on its own semiconductor chip and having a) a current source of substantially known and stable current;

b) a representative MOS transistor having a drain coupled to said current source, a source coupled to a first voltage rail, and a gate, said representative MOS transistor being of a known relative first size; c) at least one output device, each output device having a bus driver, and each bus driver having a first MOS transistor having a source coupled to said first voltage rail, a drain coupled to a bit of said unterminated data bus, and a gate coupled to said gate of said representative MOS transistor such that each first MOS transistor mirrors current in said representative MOS transistor, each first MOS transistor being of a known relative second size, wherein for each transmitter, said representative MOS transistor and said at least one output device are located on a single chip, and for each transmitter, said representative MOS transistor conducts said known and stable current from said current source, and each said bus driver, when ON, conducts a current related in size to said known and stable current as a function of said relative second size and said relative first size, such that said current related in size to said known and stable current is within a range of substantially ±20% for all transmitters for all semiconductor chips of said system.

28. A system according to claim 27, wherein:

said at least one output device comprises a plurality of output devices.

29. A method for stabilizing MOS output devices on a chip which are coupled to an unterminated data bus, comprising:

a) providing a substantially known and stable current to a representative MOS transistor on the chip, where said representative MOS transistor is of a known relative size;

b) providing said output devices with driving transistors of substantially identical sizes which are known relative to said representative MOS transistor; and c) arranging said output devices in current mirror relationships with said representative MOS transistor, such that said known and stable current is mirrored in said driving transistors of said output devices when said output devices are ON to provide substantially equal driving currents which are related in size to said known and stable current.

* * * * *